United States Patent [19]

Nutz et al.

[11] Patent Number: 4,737,671
[45] Date of Patent: Apr. 12, 1988

[54] CIRCUIT FOR DETECTING THE CURRENT FLOW OF A TRIAC

[75] Inventors: Karl-Diether Nutz, Oedheim; Willy Frank, Heilbronn, both of Fed. Rep. of Germany

[73] Assignee: Telefunken electronic GmbH, Heilbronn, Fed. Rep. of Germany

[21] Appl. No.: 878,335

[22] Filed: Jun. 25, 1986

[30] Foreign Application Priority Data

Jun. 25, 1985 [DE] Fed. Rep. of Germany ....... 3522586

[51] Int. Cl.$^4$ .................. H03K 17/72; H03K 17/18
[52] U.S. Cl. ................................ 307/632; 307/360; 363/54; 363/57
[58] Field of Search .............. 307/252 B, 360; 363/54, 363/57

[56] References Cited

U.S. PATENT DOCUMENTS 4,158,164  6/1979  Nutz ............................. 307/252 B
4,597,038  6/1986  Stacey ............................. 363/57

Primary Examiner—John Zazworsky
Attorney, Agent, or Firm—Spencer & Frank

[57] ABSTRACT

A circuit for detecting current flow in a triac, wherein the circuit operates with only one operating voltage with one pole of this operating voltage being connected to a current terminal of the triac and simultaneously being the voltage reference point for the triac. The triac gate voltage fluctuating around the voltage reference point is used to detect the triac current flow, the gate voltage of the triac is transformed, if necessary, into the voltage range of the operating voltage of the detector circuit, and digital information is generated as a function of the gate voltage to indicate whether a load current is flowing in the triac or not.

21 Claims, 3 Drawing Sheets

CIRCUIT FOR DETECTING THE CURRENT FLOW OF A TRIAC

BACKGROUND OF THE INVENTION

When universal motors are controlled with the aid of a phase control system, current and voltage are not necessarily in phase (cos $\neq$1). If a triac were to be supplied with a trigger pulse during a lag phase and thus at a point in time at which the triac is still carrying current, this would lead to gaps in the load current. To avoid this undesirable effect, a current detector is used in phase control systems to determine whether current flows through the triac or not.

In the past, current flow in a triac has been detected by using the voltage across the triac employed as a power switch, i.e., the voltage between terminals H1 and H2. However, this known current flow detection has the drawback that a separate circuit input and an external resistor are needed to detect the voltage across the triac. Since present-day phase control systems are known to be integrated, a separate circuit input and an external resistor involve additional expenditures which are not desirable.

SUMMARY OF THE INVENTION

It is the object of the invention to provide a circuit for detecting current flow in a triac, and thus a current detector which is fully integratable without peripheral expenditures. This is accomplished according to the invention in a circuit for detecting current flow in a triac in that this circuit operates with only one operating voltage; that one pole of this operating voltage is simultaneously the reference point of the triac; and the triac gate voltage fluctuating around the reference point is used to detect current flow in the triac. The circuit transforms the gate voltage of the triac into the range of the operating voltage of the detector circuit and generates digital information as a function of the gate voltage, with such information indicating whether a load current is flowing in the triac or not.

The invention will now be described in greater detail by way of embodiments.

DETAILED DESCRIPTION OF THE PREFERRED EMBODIMENTS

According to the invention, the information necessary for current flow detection and thus for the current detector is taken from the signal at the control output of the integrated circuit, which signal is simultaneously the control voltage at the triac gate.

Figure 1:
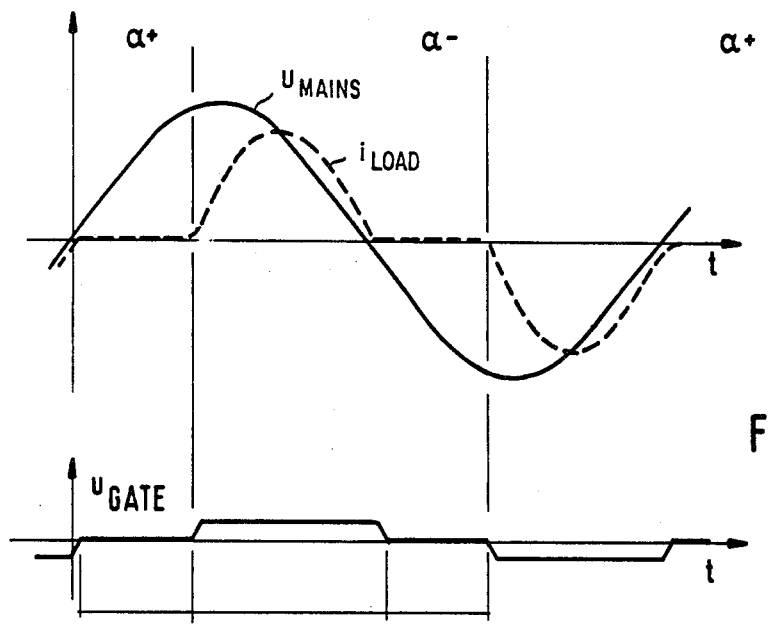
FIG. 1 shows the relationship of the load current, the mains voltage and the gate voltage of a triac.

FIG. 1 shows the curve of the mains voltage $u_{mains}$, of the triac load current $i_{load}$ and of the gate voltage $u_{gate}$ at the triac gate. As an be seen in FIG. 1, the gate voltage $u_{gate}$ is zero if the triac is without current, while conversely the gate voltage is other than zero if the triac is carrying current.

Figure 2:
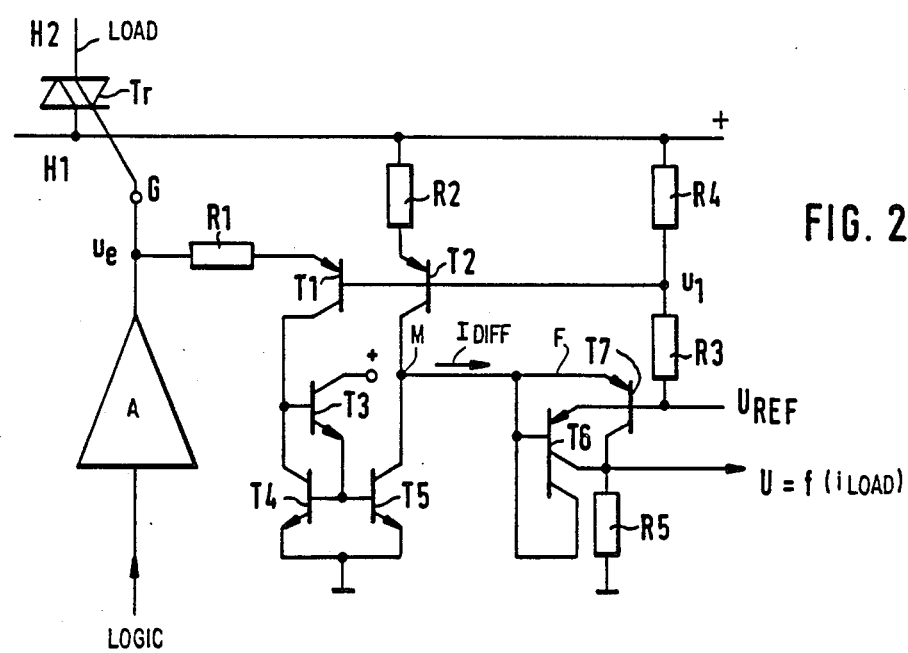
FIG. 2 is a schematic circuit diagram of one embodiment of a detector circuit according to the invention.

Since during the current carrying phase, the gate voltage of a triac may lie between 3 V and 400 mV, depending on the load current and the temperature, the detector circuit (current detector) must operate as a window discriminator with approximately ±300 mV around the triac reference point. FIG. 2 shows an embodiment of a circuit for detecting current flow in a triac which meets both this requirement and the triac specific requirement of negative triggering. In addition, the circuit of FIG. 2 and its cost-effective simple power supply manages with only one operating voltage.

In the circuit of FIG. 2, voltage $u_e$ is picked up at the gate terminal G of triac Tr. The collector current of transistor T1 depends on the voltage $u_e$ at the gate of the triac. Transistor T2 serves to generate the reference current. Reference transistor T2 receives its base voltage by means of a voltage divider composed of resistors R3 and R4 connected between reference voltage $u_{ref}$ and the pole of its operating or supply voltage connected to terminal H1 of the triac and serving as the reference voltage point of the triac. The division point of the voltage divider R3, R4 is connected to the base of reference transistor T2. A resistor R2 is connected between "this same operating voltage point, i.e., the reference voltage point of triac Tr and the emitter of transistor T2. The reference current is the collector current of reference transistor T2.

Like the base of transistor T2, the base of transistor T1, which generates a current dependent on the triac gate voltage, is connected to the division point of the voltage divider R3, R4. A resistor R1 is connected between the emitter of transistor T1 and the gate G of triac Tr. The two resistors R1 and R2 should, if possible, have the same electrical properties and therefore the same resistance value. This is easily achieved by integrating both resistors together with the rest of the circuit in a common semiconductor chip.

If, in addition to resistors R1 and R2, the two transistors T1 and T2 also have the same electrical properties (also achieved by joint integration), the collector current through transistor T1 and the collector current through transistor T2 (reference current), considered absolutely, are of identical magnitude if triac Tr is not conducting a load current.

The collector current of transistor T1 is inverted by a current mirror circuit composed of transistors T3, T4 and T5. The inverted collector current of transistor T1 and the collector current (reference current) of transistor T2 both flow via a point M into a joint line F. Since both currents are of identical magnitude, they cancel each other out in line F and then result in a differential current $I_{diff}$ of zero if the load current of triac Tr is zero. If, on the other hand, load current is flowing through triac Tr, the gate voltage $\neq 0$ and the collector current of transistor T1 is unequal to the reference current $I_{ref}$. In this case, a current is flowing in line F that is proportional to triac gate voltage $u_e$.

The differential current $I_{diff}$ flowing in line F is rectified by a current mirror including transistor T6 and a transistor T7 operated in a common base circuit. A collector of transistor T6 is connected to the base of transistor T6. In the embodiment of FIG. 2, transistor T7 transmits the positive half-wave and transistor T6 the negative half-wave of differential current $I_{diff}$. The differential current rectified in T6, T7 generates at resistor R5 a voltage U which is a function of the gate voltage of triac Tr and thus an indicator for the flow of current in the triac.

The gate voltage of a triac Tr may assume very low values, for example, if the mains voltage at the start of a half-wave is still low, if the mains voltage at the end of a half-wave of the mains voltage becomes low again, or if the load connected to the triac is very small. The latter is the case if the load current is low. To obtain the desired information (logic 1 or logic 0) about the flow of load current in the triac even with low gate voltages, a sensitive circuit is required which supplies the desired information even with low gate voltages and has a low threshold. The fact must be taken into consideration here that the triac gate voltage is a changing value which fluctuates around the reference point of the triac. In the circuit according to the invention, this triac reference point is also the reference point (positive pole) of the detector circuit. It is in fact difficult to detect voltages which—as in the case at hand—are higher and more positive than the circuit reference point voltage (positive pole). Voltages more positive than the reference point voltage (positive pole) occur in this case if the triac is conducting current in the positive half-wave of the mains voltage.

Figure 3:
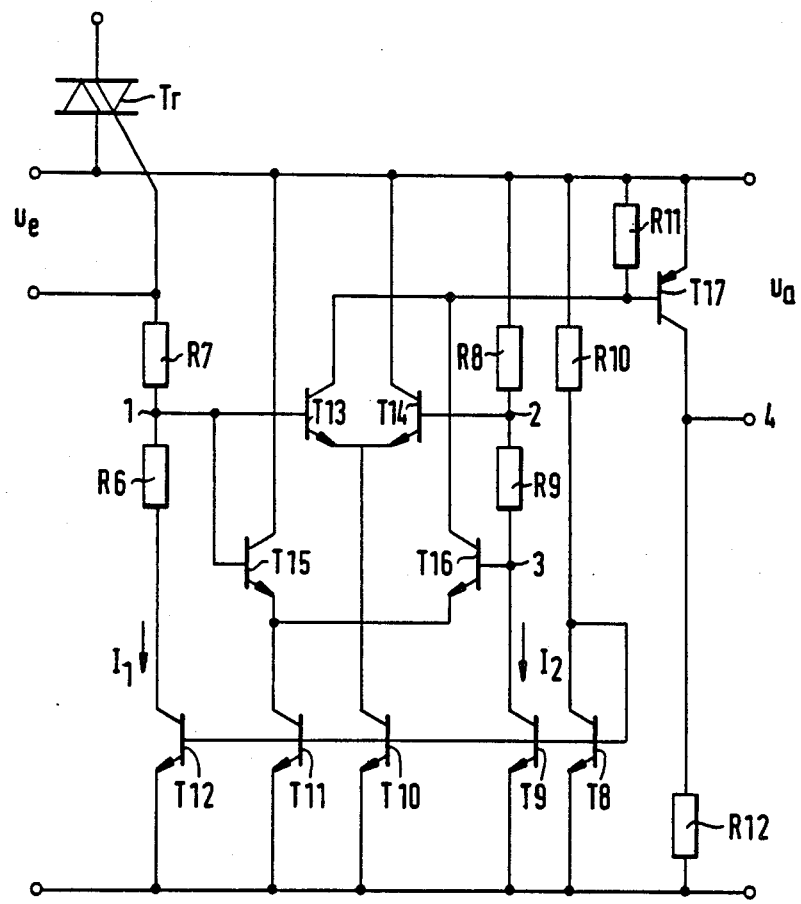
FIG. 3 is a schematic circuit diagram of a particularly sensitive preferred embodiment of a detector circuit according to the invention.

FIG. 3 shows a particularly sensitive detector circuit according to the invention which indicates the presence of load current flow even with relatively low gate voltages. The detector circuit according to FIG. 3 essentially comprises two voltage dividers R6, R7 and R8, R9 and two comparators T13, T14 and T15, T16. Identical constant currents flow through the two voltage dividers and their resistors have the same overall resistance values.

In the circuit according to FIG. 3, the series connection of resistor R10 with transistor T8, which is connected as a diode, is used to set the constant currents. If transistor T8 is not conductive, the entire current flows into the base of transistor T8, triggering the base of transistor T8 and the bases of transistors T9, T10, T11 and T12, which are connected to the base of transistor T8. As a result, transistors T8, T9, T10, T11 and T12 become conductive. Since the bases of transistors T8 to T12 are connected to one another and the emitters of these transistors are also connected to one another, transistors T8 and T12 all have the same $U_{BE}$, and therefore all supply the same collector current. Therefore, transistors T9 to T12, in conjunction with transistor T8, constitute a multiple constant current source. Transistor T8 regulates the base voltages of all transistors T9 to T12 to that value which is necessary to furnish the desired constant current for the individual branches of the circuit.

Since the triac gate voltage fluctuates around the reference point of the circuit, it cannot be used directly; instead, it must be transformed into a range which lies within the range of the operating voltage of the circuit.

At resistors R6 and R7 of the first voltage divider, a voltage drop results which is always constant because the current flowing through these resistors remains constant.

The triac gate voltage is superposed on this voltage. The voltage at point 1 is the result of the sum of the voltage at resistor R6 ± the gate voltage.

The voltage divider composed of resistors R8 and R9 forms a reference branch and thus functions as a reference divider which is used to set the switching points (+0.25 V and −0.25 V) of the two comparators. One of the two reference voltages is applied to point 2 and the other to point 3. The voltage at point 3 is 0.5 V more negative than the voltage at point 2. For the circuit to operate symmetrically, R7 is dimensioned so that, if $U_e=0$, the voltage at point 1 lies exactly in the middle between the voltage values at points 2 and 3.

If the voltage at point 1 is more positive than that at point 2—which is the case if a load current is flowing in the triac in the positive half-wave and thus the gate voltage is positive—then transistor T17 becomes conductive and the output voltage of the circuit at point 4 corresponds to a logic 1, which is equivalent to a load current flowing in the triac. In this case, we are in the hatched area 5 in FIG. 4, which indicates when the triac is switched on or off and then the triac is carrying a load current and when not. The two threshold points of +0.25 V and −0.25 V are plotted on the ordinate of FIG. 4. The gate voltage is symbolized by a triangular positve half-wave and by a triangular negative half-wave. In the positive half-wave, the circuit according to FIG. 3 indicates a load current flow as a logic 1 appearing at the output if the triac gate voltage in the positive half-wave exceeds the switching voltage of +0.25 V. This is the case in the hatched area 5.

Figure 5:
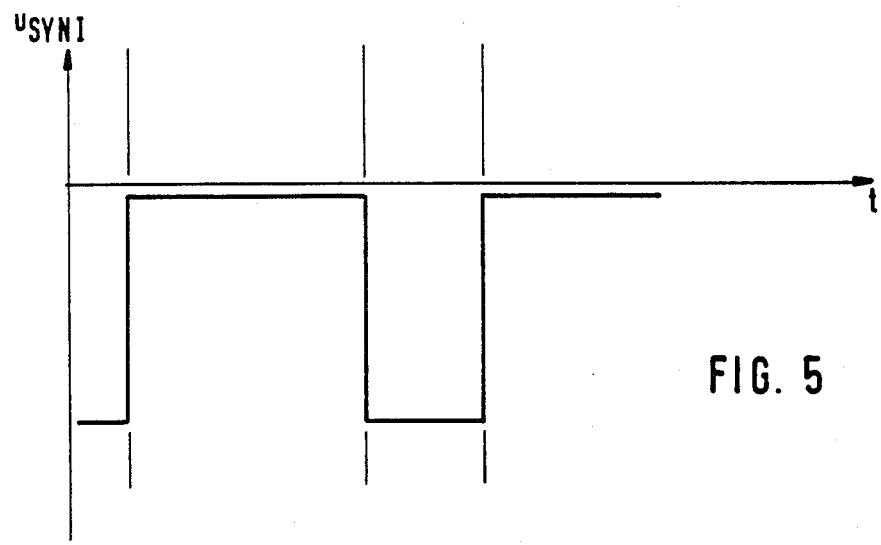
FIG. 5 is a curve showing the digital output signal of the circuit of FIG. 3 for the gate voltage of FIG. 4.

The triac is also turned on (in this case again, load current flow is indicated) if the gate voltage of the triac during the negative half-wave falls below the switching point of −0.25 V. As shown in FIG. 5, the circuit according to FIG. 3 furnishes a logic 0 in regions 6 and 7 between switching point +0.25 V and −0.25 V, while the circuit according to FIG. 3 furnishes a logic 1 in hatched regions 5 and 8 which lie outside the switching points +0.25 V and −0.25 V.

If the load current of the triac moves towards zero, the voltage at point 1 becomes more negative than at point 2. In this case, due to resistor R9, transistor T17 is switched off and the logic 0 state at circuit output 4 is generated.

The above embodiments are based on the conditions in the positive half-wave of the mains voltage. In the following, the conditions in the negative half-wave of the mains voltage will be described. While the first comparator comprising transistors T13 and T14 is responsible for the positive half-wave of the mains voltage, the second comparator composed of transistors T15 and T16 is responsible for the negative half-wave of the mains voltage. If a load current flows during the negative half-wave of the mains voltage, a negative voltage is generated at the gate of the triac. This negative gate voltage is superposed on the voltage at point 1, thus making the voltage at point 3 more positive than that at point 1. In this case, transistor T16 triggers transistor T17, so that a logic 1 is generated at point 4.

Since the emitters of the comparator transistors are connected together, only that comparator transistor of the two comparator transistors of a comparator whose base is more positive than the base of the other transistor is conductive. If transistor T15 is conductive in the second comparator, this has no effect on output 4. If, however, transistor T16 is conductive, this does have an effect on output 4, in that a logic 1 is generated at output 4, since transistor T16 triggers transistor T17.

Figure 4:
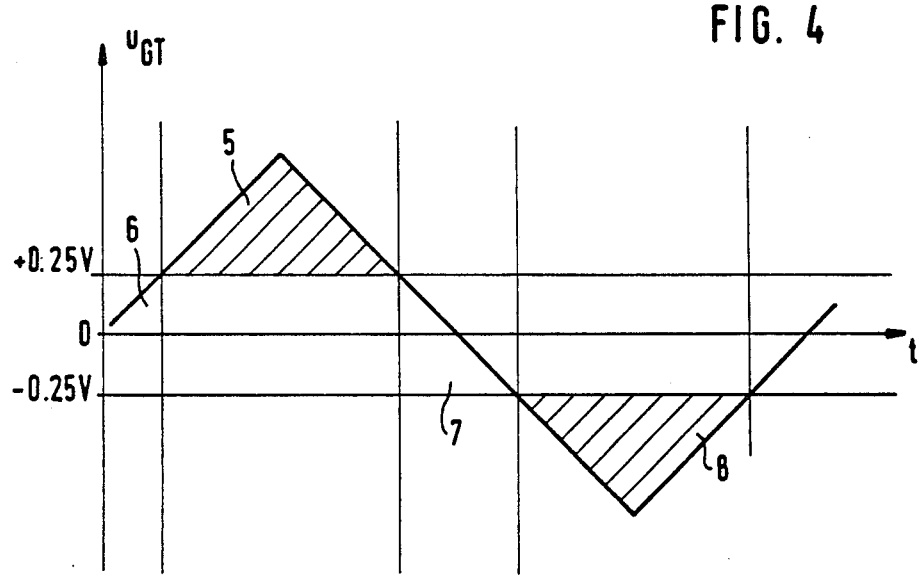
FIG. 4 is a curve showing the variation for the gate voltage $U_{GT}$ of the triac of FIG. 3 for two successive half-waves of the mains voltage.

Moving along the triangular curve of FIG. 4, for example, from bottom right to top left, transistor T17 is conductive in the lower region, since point 3 of the circuit has a more positive voltage than point 1. Point 4 of the circuit shows a logic 1 in this region. If one passes, coming from below, through the switching point of −0.25 V, the current flow changes, i.e. the constant current made available by transistor T11 is taken over by transistor T15, since point 1 is more positive than point 3. Transistor T17 thus also becomes highly resistive and thus non-conductive, so that point 4 assumes the logic 0 state. In the voltage ranges mentioned, transistor T14 of the first comparator is conductive, since point 2 is more positive than point 1. In this case, the constant current made available by transistor T10 has no effect on transistor T17 and thus on point 4.

Continuing into the region of the positive half-wave of the gate voltage as far as the second switching point (+0.25 V), which is the case if point 1 is more positive than point 2, transistor T17 is triggered via transistor T13.

We claim:

1. A circuit for detecting current flow in a triac wherein the circuit operates with only one operating voltage with one pole of this operating voltage being connected to a current terminal of a triac and simultaneously being a voltage reference point for the triac; and wherein said circuit includes: means for detecting the triac gate voltage fluctuating about said voltage reference point as an indication of the triac current flow; and means, responsive to an output signal from said means for detecting, for producing digital output information as a function of the detected gate voltage indicating whether or not a load current is flowing in the triac.

2. A circuit according to claim 1 wherein said means for detecting includes circuit means for transforming the gate voltage of the triac into the voltage range of said one operating voltage.

3. A circuit according to claim 1, wherein said means for generating digital information generates the digital information independent of the polarity of the triac gate voltage.

4. A circuit according to claim 1, wherein: said means for detecting includes first circuit means for generating a reference current, second circuit means for generating a current dependent on the gate voltage of the triac, and third circuit means for generating a differential current by forming the difference between these two generated currents; and said means for producing includes means for rectifying said differential current.

5. A circuit according to claim 4 wherein said second circuit means generates a current dependent on the gate voltage which, in the event the gate voltage of the triac is zero, is substantially equal in absolute amplitude to the reference current.

6. A circuit according to claim 5 wherein said means for rectifying said differential current includes a current mirror circuit having a first transistor which allows one half-wave of the differential current to pass and a second transistor connected as a diode which allows the other half-wave to pass.

7. A circuit according to claim 4 wherein said first circuit means includes a reference transistor and a voltage divider which are provided to generate the reference current, said voltage divider having a reference voltage applied to it and having its division point connected to the base of said reference transistor.

8. A circuit according to claim 7 wherein a resistor is connected between the voltage reference point and the emitter of said reference transistor.

9. A circuit according to claim 4 wherein said second circuit means includes a further transistor which is provided to generate the current dependent on the triac gate voltage, with the base of said further transistor being connected to the division point of said voltage divider, and the emitter of said further transistor being connected via a resistor to the gate of the triac.

10. A circuit according to claim 9 wherein the resistor connected beween the voltage reference point and the emitter of the reference transistor and the resistor connected between the gate of the triac and the emitter of the further transistor generating the gate dependent current have the same resistance values.

11. A circuit according to claim 4 wherein said third circuit means includes a current mirror circuit for inverting the current dependent on the triac gate voltage and for combining the inverted current provided by said mirror circuit with said reference current.

12. A circuit according to claim 2 wherein said means for detecting comprises:
two voltage dividers, each fed from a respective constant current source, and with one of said two voltage dividers being connected to provide reference voltages, and with the other of said two voltage dividers being connected to provide a voltage corresponding to said gate voltage of the triac; and two comparators each having two transistors and each fed from a respective constant current source, with each of said comparators comparing said voltage corresponding to said gate voltage provided by said other voltage divider with a respective reference voltage provided by said one of said voltage dividers.

13. A circuit according to claim 12 wherein the resistors of the two voltage dividers have the same overall resistance values.

14. A circuit according to claim 12 wherein transistors having interconnected bases are provided as said constant current sources.

15. A circuit according to claim 4 wherein a further transistor is provided to trigger the bases of the constant current source transistors, with the collector of said further transistor being connected to its base and, via a resistor, to the voltage reference point.

16. A circuit according to claim 15 wherein said one voltage divider is connected between its respective constant current source and said voltage reference point.

17. A circuit according to claim 16 wherein said other voltage divider is connected between its respective constant current source and a point to which the gate voltage of the triac is applied.

18. A circuit according to claim 14 wherein the constant current source transistors have the same electrical properties.

19. A circuit according to claim 18 wherein the emitters of the two transistors of each comparator are interconnected.

20. A circuit according to claim 18 wherein the emitter collector path of one transistor of each comparator is connected between its respective constant current source and said voltage reference point, and the emitter collector path of the other transistor of each comparator is connected between its respective constant current source and the base of a transistor whose emitter-collector path forms the output of the circuit.

21. A circuit according to claim 20 wherein in one of said comparators, said one transistor has its base connected to the division point of said one voltage divider and said other transistor has its base connected to the division point of said other voltage divider; and wherein in said other of said comparators, said one transistor has its base connected to said division point of said other voltage divider and said other transistor has its base connected to a point between said first voltage divider and its series connected respective constant current source.

* * * * *